United States Patent [19]
Bentlage et al.

[11] Patent Number: 5,650,595
[45] Date of Patent: Jul. 22, 1997

[54] ELECTRONIC MODULE WITH MULTIPLE SOLDER DAMS IN SOLDERMASK WINDOW

[75] Inventors: Mark Rudolf Bentlage, Johnson City; Kenneth Michael Fallon, Vestal, both of N.Y.; Lawrence Harold White, Corvallis, Oreg.

[73] Assignee: International Business Machines Corporation, Armonk, N.Y.

[21] Appl. No.: 450,441

[22] Filed: May 25, 1995

[51] Int. Cl.$^6$ .................................................. H05K 1/02
[52] U.S. Cl. ..................... 174/260; 361/768; 361/771
[58] Field of Search ............................. 174/260, 261; 439/83; 361/767, 768, 771; 257/737, 738

[56] References Cited

U.S. PATENT DOCUMENTS

| | | | |
|---|---|---|---|
| 3,401,126 | 9/1968 | Miller et al. | 252/514 |
| 3,429,040 | 2/1969 | Miller | 29/626 |
| 3,436,818 | 4/1969 | Merrin et al. | 29/626 |
| 3,564,522 | 2/1971 | Stevens, Jr. | 340/174.1 |
| 3,949,125 | 4/1976 | Roberts | 428/99 |
| 4,229,248 | 10/1980 | Silverman et al. | 156/653 |
| 4,462,534 | 7/1984 | Bitaillou et al. | 228/180 |
| 4,504,283 | 3/1985 | Charvat | 51/298 |
| 4,546,541 | 10/1985 | Reid | 29/603 |
| 4,579,806 | 4/1986 | Schupp et al. | 430/280 |
| 4,761,699 | 8/1988 | Ainslie et al. | 360/103 |
| 4,818,728 | 4/1989 | Rai et al. | 437/209 |
| 4,825,284 | 4/1989 | Soga et al. | 357/80 |
| 4,864,471 | 9/1989 | Hargasser et al. | 361/417 |
| 4,996,623 | 2/1991 | Erpelding et al. | 360/104 |
| 4,999,699 | 3/1991 | Christie et al. | 357/65 |
| 5,121,190 | 6/1992 | Hsiao | 57/80 |
| 5,128,746 | 7/1992 | Pennisi et al. | 357/12 |
| 5,334,857 | 8/1994 | Mennitt et al. | 257/48 |
| 5,378,859 | 1/1995 | Shirasaki et al. | 174/261 |
| 5,574,629 | 11/1996 | Sullivan | 361/767 |

OTHER PUBLICATIONS

E. W. Clavez et al., "Solder Stop for Contact Pin", *IBM Technical Disclosure Bulletin*, vol. 10, No. 1, Jun. 1967, p. 7.

D. L. Elam et al., "Selective Plating for Surface–Mounted Component Lead", *IBM Technical Disclosure Bulletin*, vol. 29, No. 4, Sep. 1986, pp. 1652–1653.

N. G. Koopman et al., "Controlled Solder Dam Structure by Special Evaporation–Gun Design", *IBM Technical Disclosure Bulletin*, vol. 29, No. 11, Apr. 1987, pp. 4880–4881.

S. K. Kang et al., "Tape Structure for Controlled Solder Attachment", *IBM Technical Disclosure Bulletin*, vol. 33, No. 10A, Mar. 1991, pp. 38–39.

*Primary Examiner*—Laura Thomas
*Attorney, Agent, or Firm*—Baker, Maxham, Jester & Meador

[57] ABSTRACT

The present method employs a first plating resist for forming circuit lines on a carrier substrate. While the plating resist is still in place a metal, such as nickel, is deposited on top of the circuit lines. A second plating resist is employed for plating solder on the circuit lines at solder sites. At this stage additional solder can be deposited at each solder site to provide or supplement the necessary low melt solder required for forming a solder joint. The first and second resists along with solder thereon are then stripped and copper foil on the carrier substrate is etched away around the circuit lines. A soldermask is then formed on the carrier substrate over the circuit lines except for circuit lines in the chip sites. The soldermask has a single large opening at each chip site which has lateral dimensions which are slightly larger than the lateral dimensions of the chip to be connected at the chip site. During curing of the soldermask, which involves heat, the nickel layer on top of the circuit lines within the chip site opening quickly oxidizes to provide solder dams which extend along the lengths of the lines within the chip site openings immediately adjacent the solder sites. The chips are then placed within the soldermask windows and electrically connected by solder joints to the solder sites of the circuit lines by a flip chip attach method. The chip sites are then encapsulated with an underfill encapsulant to protect the solder joints.

26 Claims, 6 Drawing Sheets

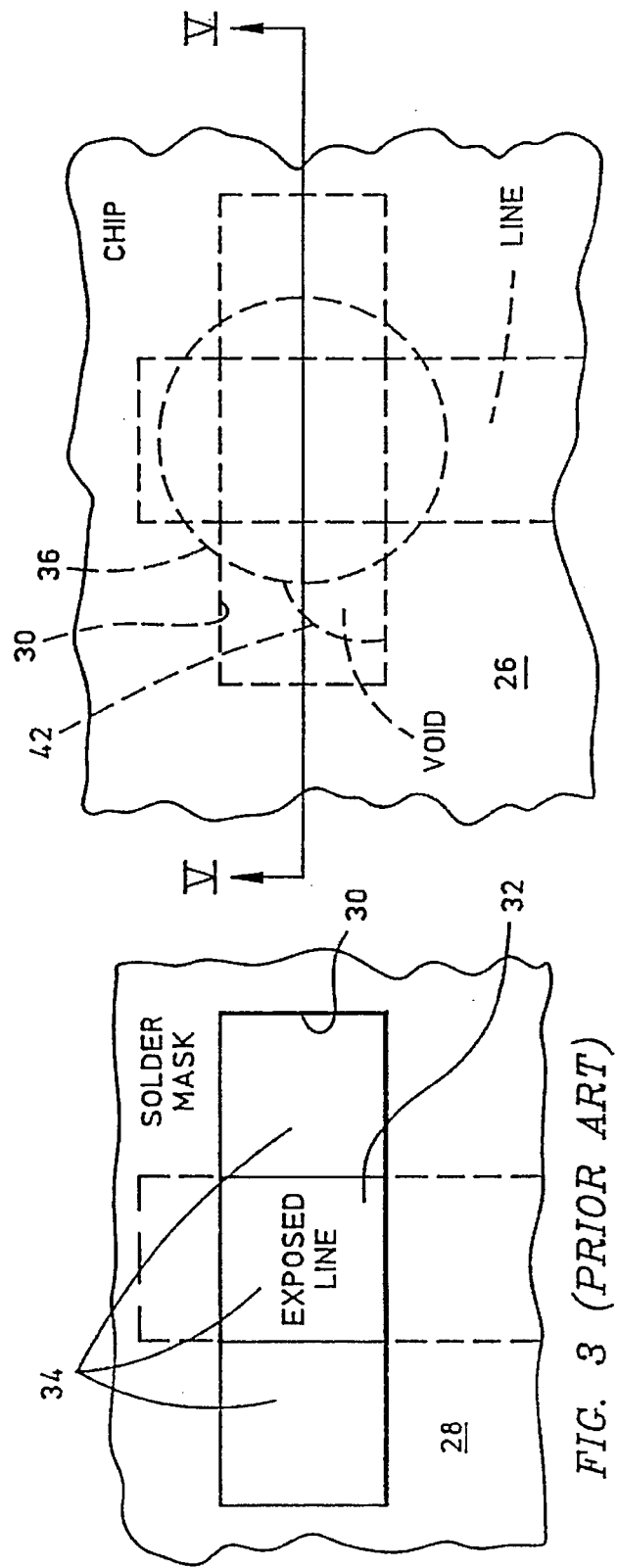
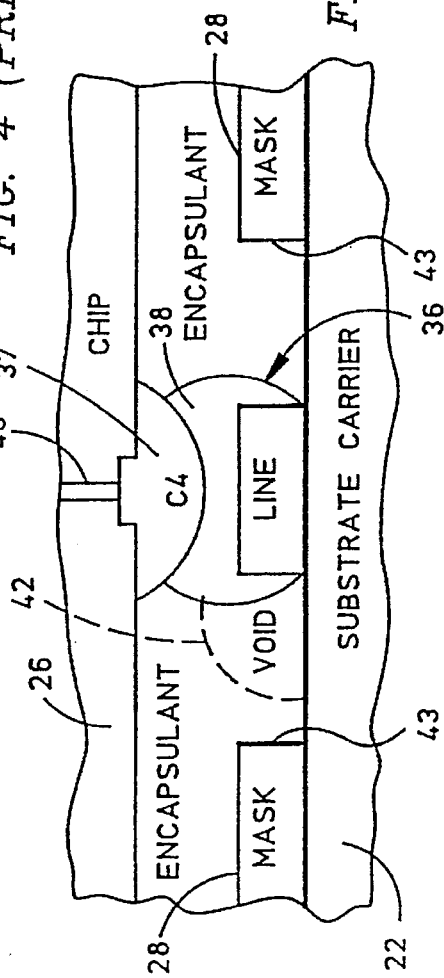
FIG. 3 (PRIOR ART)
FIG. 4 (PRIOR ART)
FIG. 5 (PRIOR ART)

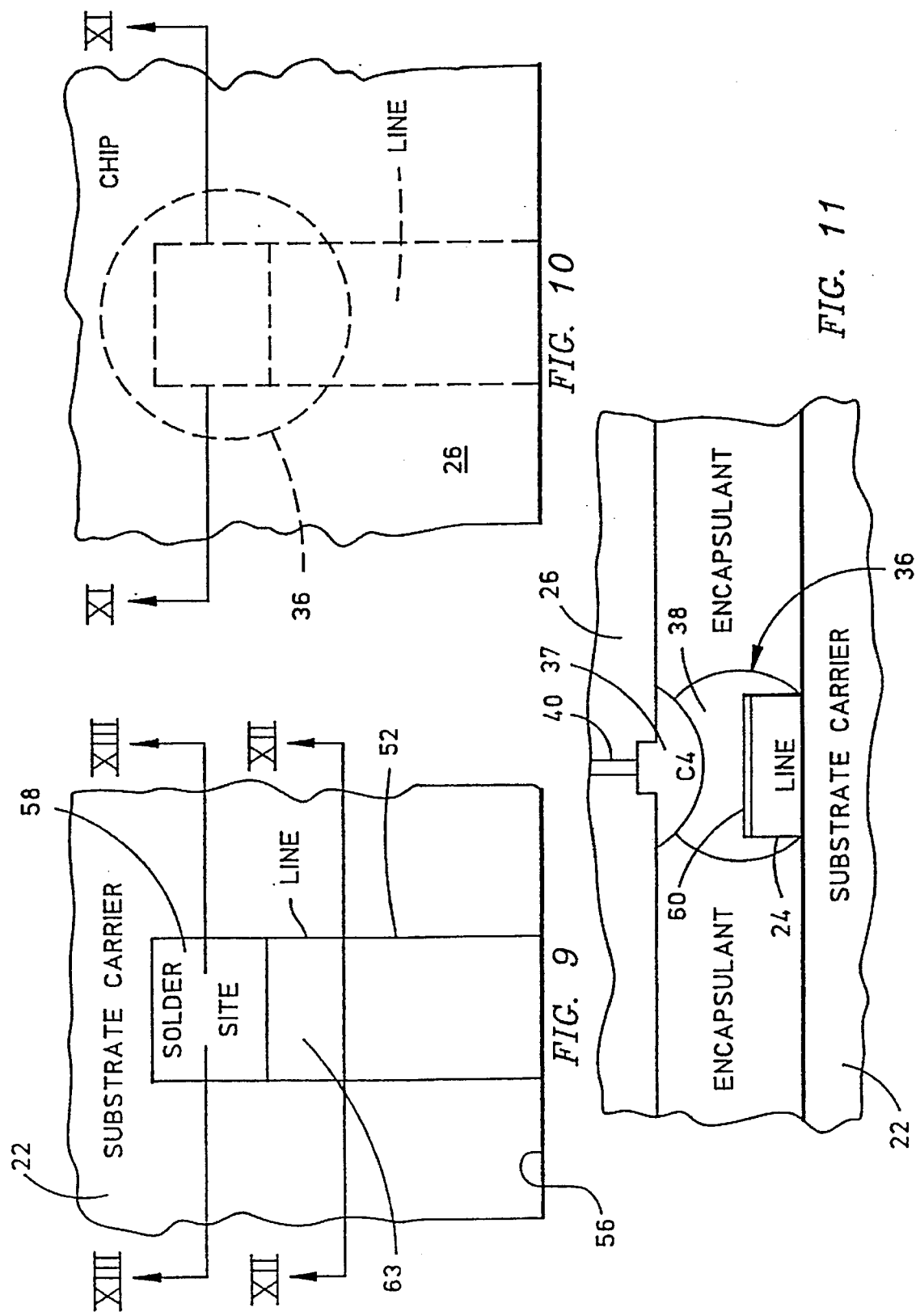

ELECTRONIC MODULE WITH MULTIPLE SOLDER DAMS IN SOLDERMASK WINDOW

BACKGROUND OF THE INVENTION

1. Field of the Invention

The present invention relates to an electronic module and method of making which employs a chip carrier with metal oxide solder dams on top of circuit lines, the circuit lines having end portions which are located within a soldermask window and are attached to a chip by solder joints.

2. Description of the Related Art

An electronic module includes a plurality of integrated circuit semiconductor devices, hereinafter referred to as chips, which are electrically connected at multiple sites to circuit lines on a carrier substrate. The carrier substrate is an epoxy fiberglass board which has circuit lines between the various chips and has vias which connect the circuit lines to other circuit lines and/or components on an opposite side of the board or to components laminated within the board. One flat side of a chip has multiple C4 solder balls or solder bumps which are soldered to electrodes within the chip. C4 ("Controlled Collapse Chip Connection") signifies that reflow of solder to form a solder joint can be controlled to produce a desired standoff of the chip from the carrier substrate. In some cases the solder bump on the chip may be solder having a high melting point ("high melt solder") and the solder on the circuit line may be solder with a low melting point ("low melt solder"). With this arrangement the solder ball acts as a stud to produce a standoff of the chip from the substrate. The area around each solder joint is encapsulated to protect the joint from moisture and chemicals. If all the solder joints are properly encapsulated the electronic module will have a long life. Unfortunately many prior art methods of production do not properly fill the solder joints with an encapsulant.

In prior art methods of producing electronic modules an initial step is to pattern the carrier substrate with resist and then plate the circuit lines. These circuit lines are plated on top of a copper foil layer which rests on top of the carrier substrate. Solder is then typically deposited as an etch resist on the circuit lines, the first resist is stripped and the copper foil about the circuit lines is removed with an etchant and solder is removed. A soldermask is then formed with an opening for each solder joint. Each circuit line extends below the soldermask and is covered thereby except for a line segment which is exposed through a soldermask window. Because of the sizes of the soldermask openings it is very difficult to properly register the prior art soldermask openings with the numerous solder joint locations. Solder is then deposited on the line segments by pattern plating or panel plating. The chip is then laid on the carrier substrate with its solder bumps in registration with the solder bumps on the board. Heat is then applied to reflow the solder and form solder joints interconnecting the chip electrodes to the circuit lines. This method of connection is known in the art as "flip chip attach" (FCA). Solder reflow can occur on either or both of the chip and line segments.

One of the last steps is to dispense an underfill encapsulant to protect the solder joints. The soldermask stays in place and forms a part of the final electronic module. In this step the encapsulant has to travel in a confined space between the chip and the carrier substrate to the many solder joints, some of which may be remotely located below a center portion of a chip. Each solder joint is surrounded by edges of a respective soldermask window. These edges impede the flow of the encapsulant throughout the soldermask window causing air voids. Air voids expand and contract due to temperature changes which can exert forces on the solder joints. These forces can separate chip electrodes from the circuit lines. Unfortunately, the step of encapsulating the solder joints is essentially the last step in the production of the electronic module. This means that production losses due to voids in the encapsulant cost more than losses due to other causes earlier in the cycle of production. There is a strong felt need for a method of making electronic modules which are free of voids and which is easier to implement.

SUMMARY OF THE INVENTION

The present invention provides a unique electronic module, which has improved integrity, and a method of making the electronic module which produces a significantly higher production yield. In the present method pattern plating is employed for forming the circuit lines on the carrier substrate in the same manner as the prior art method. The remainder of the steps in the present method are significantly different from the prior art method. While the plating resist is still in place a solder-wettable material, such as nickel, is deposited on top of the circuit lines. A second resist with a pattern for solder sites is then formed on top of the first resist. Solder is plated on the circuit lines at solder sites. At this stage additional solder can be plated at each solder site to ensure that each solder site has sufficient solder to make a good solder joint. The first and second resists are then stripped and copper foil around the circuit lines is then etched away. During this process the nickel layer on top of the circuit lines protects the circuit lines from a copper etchant.

A soldermask is then formed on the carrier substrate over the circuit lines except for the chip sites. The soldermask has a single large window at each chip site which has lateral dimensions which are slightly larger than the lateral dimensions of the chip to be connected at the chip site. Registration of the soldermask with the solder sites is easily implemented. During curing of the soldermask, which involves heat, the nickel layer on top of the circuit lines within the chip site windows quickly oxidizes. The oxidized nickel then provides solder dams which extend along the lines within a chip site to locations immediately adjacent the solder sites. The chips are then placed within the soldermask windows and the flip chip attached method is employed to electrically connect the chips to the circuit lines with solder joints. The encapsulant is dispensed at the chip site. Since there are no soldermask window edges close to the solder joints the encapsulant can easily fill around the solder joints without creating voids. Accordingly, the production yield is significantly improved and the end product has higher integrity. Essentially, the nickel oxide solder dams take the place of the small soldermask windows of the prior art so that the soldermask of the present invention is only required to mask the circuit lines beyond the chip sites.

An object of the present invention is to provide a method of making a void free electronic module.

Another object is to provide an electronic module which has a soldermask with only one soldermask opening for each chip site.

A further object is to provide a method of making an electronic module wherein a soldermask can be more easily registered with solder sites.

Still another object is to provide an electronic module which has metal oxide solder dams along end portions of circuit lines, the end portions being located within a window of a soldermask and the soldermask masking only areas outside perimeters of chip sites.

Still a further object is to provide a higher yield method of making higher integrity electronic modules at a lower cost.

Still another object is to provide a method of making electronic modules which enables providing additional solder at solder sites so that complete solder joints are made upon reflow.

Other objects and attendant advantages of the invention will be readily apparent to one skilled in the art upon reading the following description taken together with the accompanying drawings.

DESCRIPTION OF THE DRAWINGS

FIG. 3 is an enlargement of one of the circuit lines and a portion of the soldermask of FIG. 2 with a segment of the circuit line exposed by a rectangular window of the soldermask.

FIG. 4 is the same as FIG. 3 except a portion of a chip is electrically connected to the circuit line by a C4 solder ball.

FIG. 5 is a cross section of FIG. 4 taken along plane V—V of FIG. 4.

FIG. 9 is an enlargement of a portion of FIG. 8 showing one solder lead extending into a chip site.

FIG. 10 is the same as FIG. 9 except a portion of a chip is shown electrically connected to the circuit line by a C4 solder ball.

FIG. 11 is a cross-sectional view taken along plane XI—XI of FIG. 10.

DESCRIPTION OF THE PREFERRED EMBODIMENTS

Figure 1:
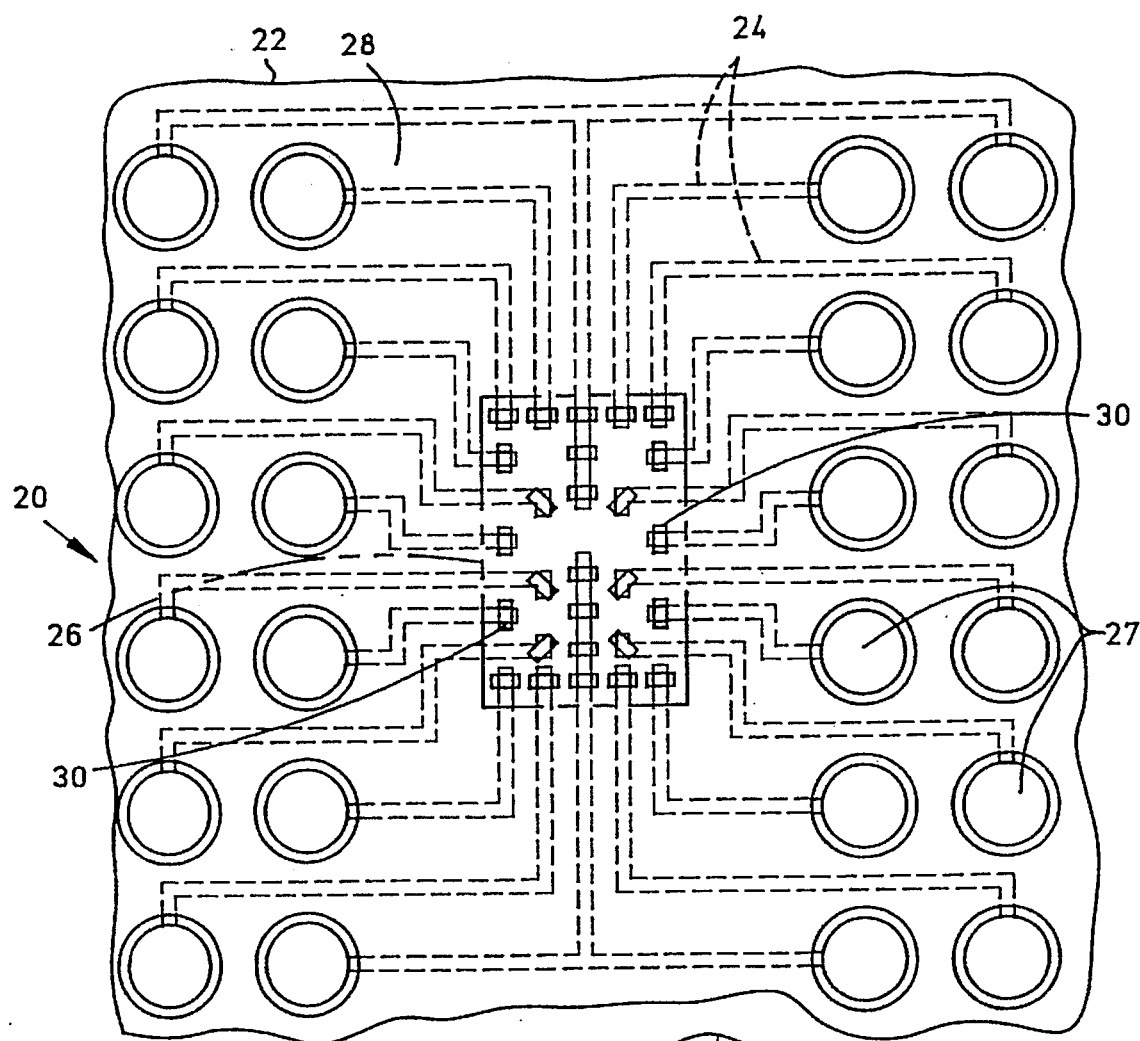
FIG. 1 is a partial plan view of a prior art electronic module.
Figure 2:
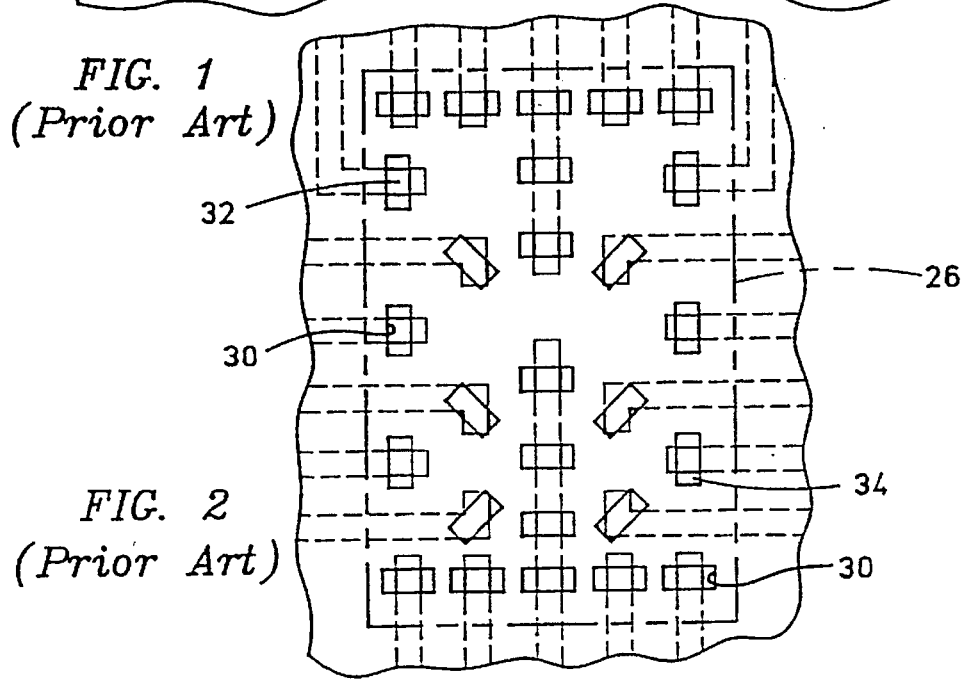
FIG. 2 is an enlargement of a center portion of FIG. 1 showing circuit lines extending into a chip site.

Referring now to the drawings wherein like reference numerals designate like or similar parts throughout the several views there is shown in FIG. 1 a portion of a prior art electronic module 20 which comprises a carrier substrate 22, a plurality of circuit traces or lines 24 which are plated on the carrier substrate. The lines which have end portions terminate within a chip site 26. Other ends of the circuit lines are connected to conductive lands 27 which are connected to chip electrodes (not shown) by substrate vias (not shown). The substrate carrier is typically a resin board and the circuit lines are typically copper. An integrated circuit semiconductor device, hereinafter referred to as a chip and shown in phantom at 26, is mounted on the substrate carrier 22 and is connected to the segments of the end portions of the circuit lines 24 which will be explained hereinafter. Overlaying the circuit lines is a soldermask 28 which has rectangular openings 30, the rectangular openings being transverse the circuit lines so as to expose line segments 32 within the chip site as shown in FIGS. 2 and 3. Each rectangular opening 30 provides a solder site 34 which exposes the aforementioned exposed line segment 32, the line segment 32 being electrically connected to the chip 26 by a solder joint 36 which includes a C4 (controlled collapse chip connection) solder bump 37 and a solder bump 38, as shown in FIG. 5. The C4 solder bump 37, which may be a high melt solder, is located on a bottom flat surface of the chip in electrical connection with a chip electrode or terminal 40 and the solder bump 38, which may be low melt solder, is located on the line segment 32. Multiple chip electrodes are electrically connected to multiple exposed circuit line segments by multiple C4 solder bumps by what is known in the art as flip chip attach (FCA). This involves laying the chip in the chip site with the multiple C4 solder bumps 37 in contact with solder bumps 38 on the multiple exposed line segments and then reflow heating this combination until the low melt solder reflows and makes solder joint connections therebetween. It is important during this process that there be sufficient solder in the solder bumps to make an effective solder joint.

After connecting the chip terminals to the exposed circuit line segments the space between the chip and the substrate carrier is filled with an encapsulant which is typically a curable organic composition containing a thermo-setting binder. The encapsulant is dispensed into the space between the chip and the substrate carrier in the chip site with the intent that all crevices will be filled and that no voids will remain. The prior art method is very susceptible to voids because of the multiple crevices and small spaces between the soldermask edges 43 and the solder joint 36, as shown in FIG. 5. Production runs of prior art electronic modules result in a portion of the electronic modules fabricated with a void 42 in the encapsulant. This void can expand and contract due to temperature changes which may break a solder joint between the chip and a line segment.

Figure 6:
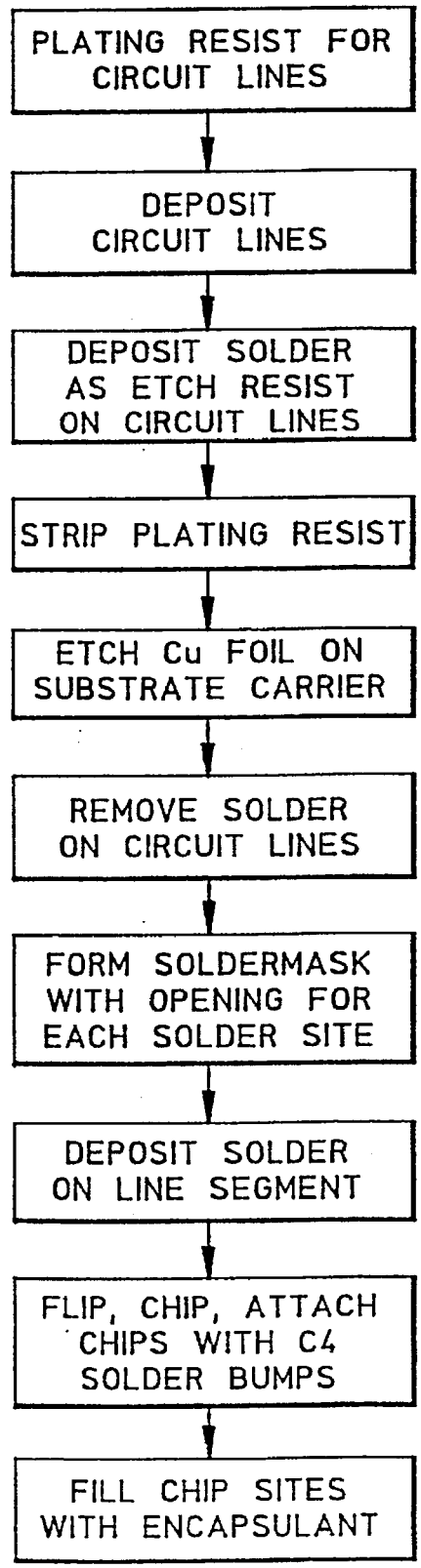
FIG. 6 is a block diagram showing an exemplary method of construction of the prior art electronic module.

The method of constructing the prior art electronic module is shown in FIG. 6. This method of construction differs significantly from the method of constructing the present invention which will be described in detail hereinafter. In the prior art method the first step is to provide a plating resist which provides a pattern for the circuit lines 24. Copper is then plated or deposited into the openings which provides the circuit line pattern as shown in FIG. 1. Plating may be accomplished by electroplating copper into the openings in the plating resist openings employing a copper foil (not shown) on the carrier substrate 22 as a return path. The resist mask employed for constructing the circuit lines is then stripped. Solder is deposited on the circuit lines as a mask while the copper foil on the carrier substrate around the circuit lines is removed by etching. Solder on the circuit lines is then removed. The next step is to form the soldermask 28 with the aforementioned openings for each solder site 32. Solder is then formed on the line segments by an appropriate method such as panel plating or electrodeposition. The chips are then placed face down (flip chip attach) with their C4 solder bumps in registration with the solder sites. The C4 solder bumps 36 are typically flattened prior to registration. Heat is then applied to reflow the solder and make the solder joints. The chip sites are then encapsulated to preserve the integrity of the solder joints. Care has to be taken during heating of the solder so that the face of the chip does not drop to restrict flow or lay on the soldermask to prevent flow of the encapsulant. The prior art soldermask provides an impediment to the flow of the encapsulant and often results in voids because of its edges around each solder site. It should be noted that the soldermask stays in place and forms a part of the completed electronic module.

Figure 7:
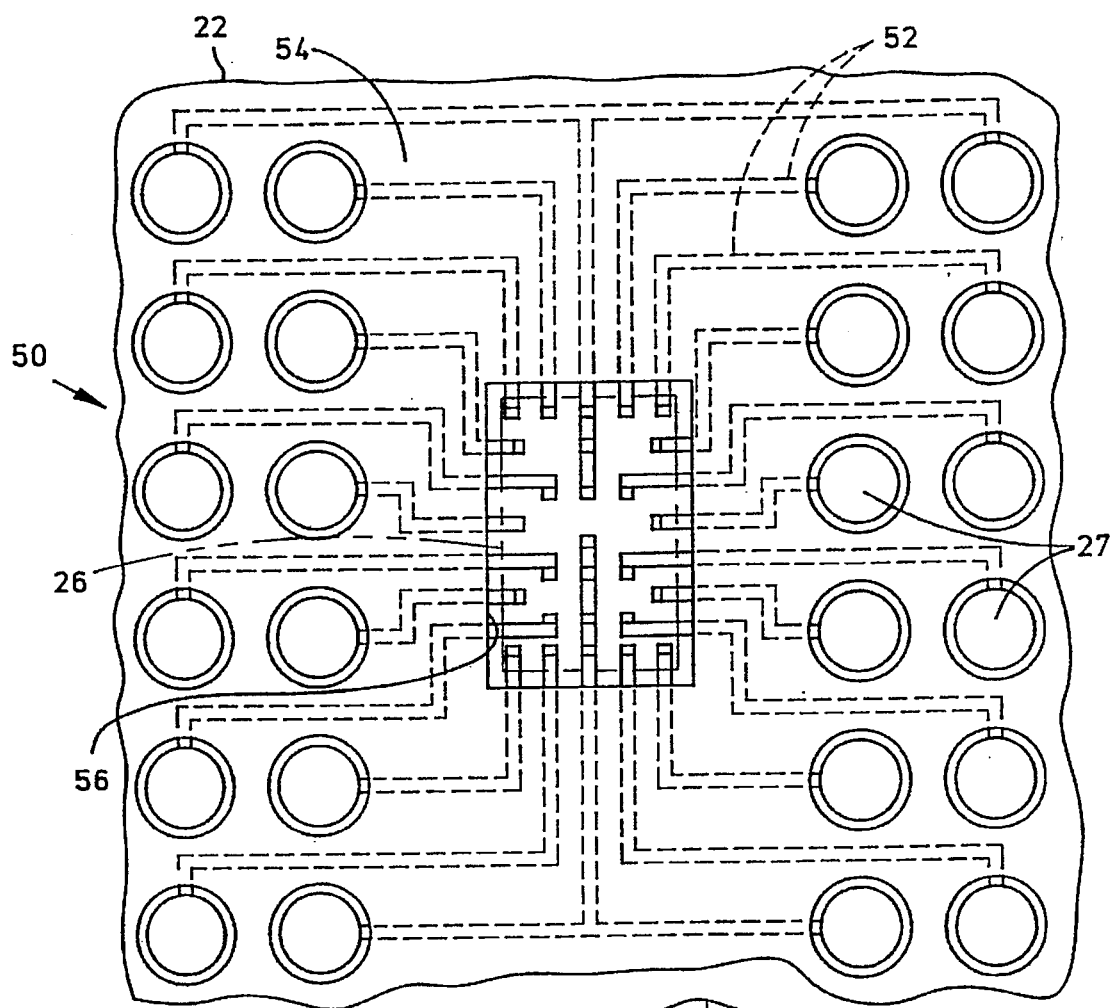
FIG. 7 is a partial plan view of the present electronic module.
Figure 8:
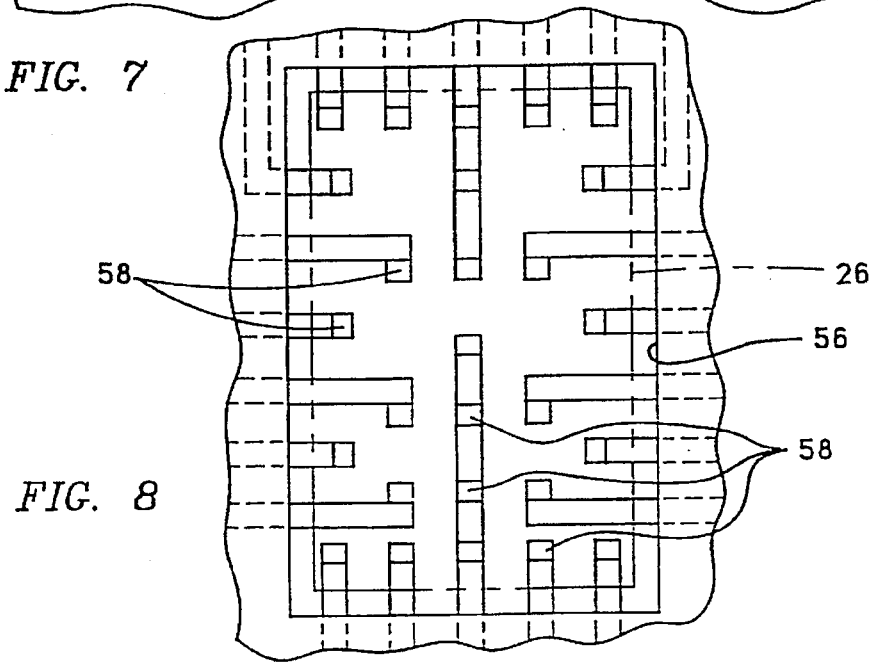
FIG. 8 is an enlargement of the center portion of FIG. 7 to show the circuit lines extending into a chip site.
Figures 12, 13, 14:
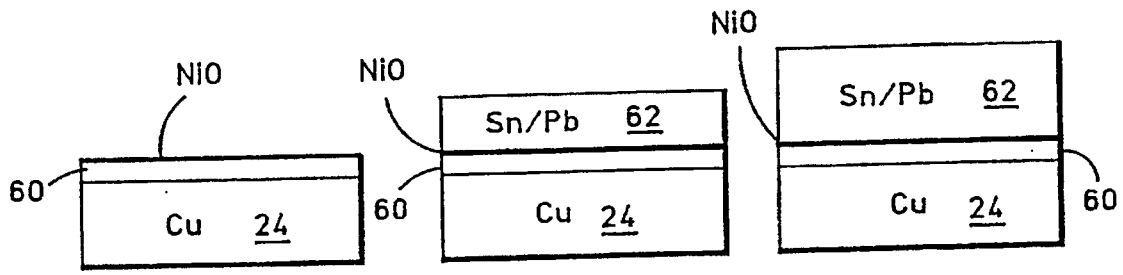
FIG. 12 is a cross section taken along plane XII—XII of FIG. 9.
FIG. 13 is a cross section taken along plane XIII—XIII of FIG. 9.
FIG. 14 is a modification of the cross section shown in FIG. 13.

The present electronic module 50 is shown in FIG. 7. This module employs the same carrier substrate 22 as the prior art electronic module 20. Major differences in the present invention are that the copper circuit lines 52 have a layer of solder-wettable metal, such as nickel, and the soldermask 54 has a large central opening 56 about the chip site 26. In contrast, the prior art circuit lines are not plated with nickel and the prior art soldermask has a rectangular opening for each solder site. The soldermask 54, which stays in place in the completed electronic module, masks only circuit lines outside the chip site 22. As shown in FIG. 8, end portions of the circuit lines extend into the opening 56. FIG. 9 shows one line extending into the opening 56. As shown in FIG. 12, the copper line is capped with a nickel layer 60. In the solder site 58 the nickel layer is covered with solder 62, which may be low melt solder, as shown in FIG. 13. The nickel 60 is oxidized as shown by the heavy lines in FIGS. 12–14. The oxidized nickel provides a solder dam at 63 so that solder will only attach to the solder site 58. The flip chip attach method constructs solder joints 36 which connect the terminals of the chip to the circuit lines to form the solder joints. The solder joints are then encapsulated as shown in FIG. 11. No voids are generated since there are no soldermask edges impeding the flow of the encapsulant around the various solder joints. In essence, the nickel oxide coatings on the circuit lines serve as soldermasks taking the place of the rectangular openings in the prior art soldermask. Because voids are eliminated production yield is significantly increased by the present invention.

Figure 15:
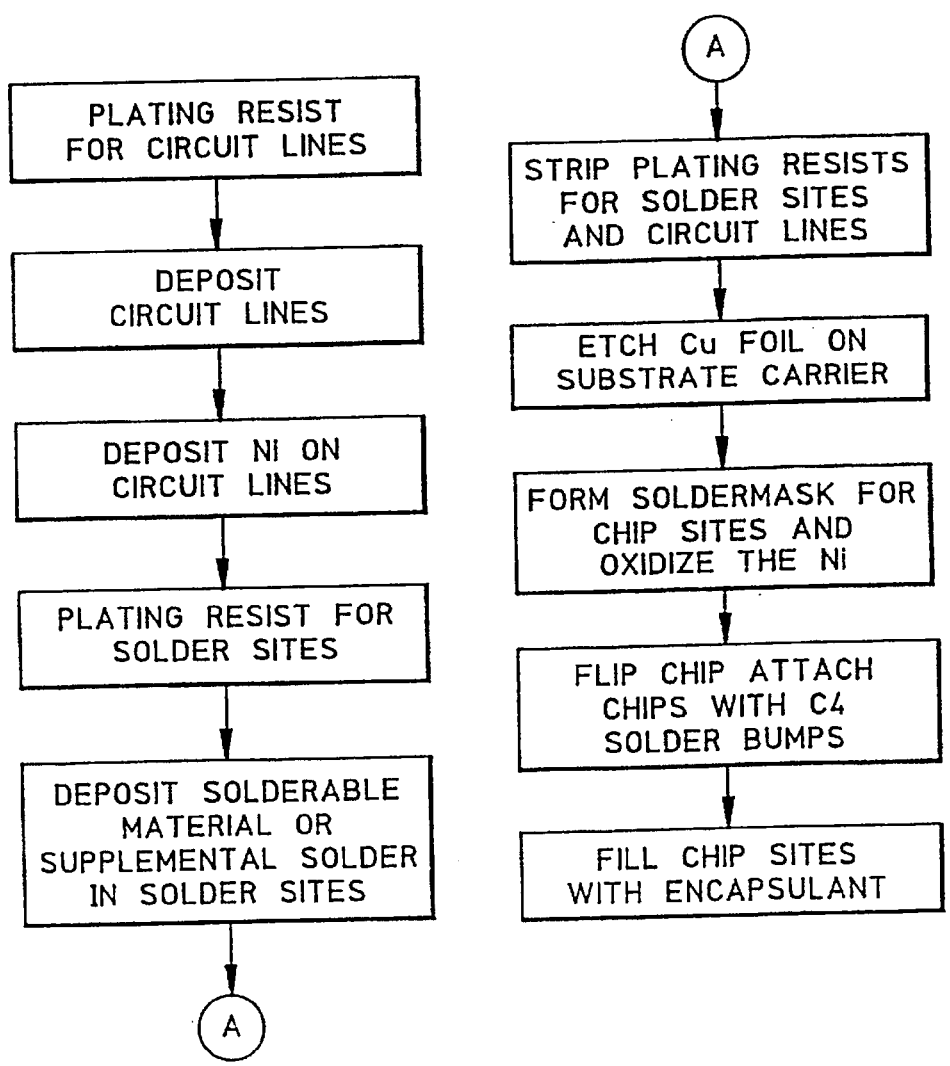
FIG. 15 is a block diagram showing the method of construction of the present invention.

The method of making the present invention is shown in FIG. 15. A first plating resist is placed on the carrier substrate which has openings for patterning the circuit lines. Copper is then electroplated or otherwise deposited in the openings for forming the circuit lines. The present method is the same as the prior art method up to this point. A solder-wettable metal, such as nickel, is then deposited on the circuit lines employing the pattern of the first plating resist. A second plating resist is then placed over the entire first plating resist except for the solder sites 58. Low melt solder is then optionally deposited in the solder sites making the solder sites solderable to the high melt C4 solder bumps on the chip. If the C4 solder bump provides a sufficient volume of solder the solder site can be coated with benzotriazole which protects the solderability of the copper circuit line and maintains a flat surface for engaging the solder butup. If the C4 solder bump on the chip is a high melt solder, which does not melt during heating, a high volume of low melt solder can be deposited in the solder sites patterned by the second plating resist so as to provide a solder volume sufficient to make a good solder joint. Optionally, if the C4 solder bump is a low melt solder but does not have sufficient volume the necessary supplemental low melt solder to make a good joint can be deposited in the solder site patterned by the second plating resist. The present invention provides many options at this stage of the method in order to assure a sufficient volume of solder in order to make a good solder joint.

The plating resist employed for the solder sites and the plating resist employed for the circuit lines are then stripped from the carrier substrate. The copper foil on the carrier substrate is then removed by etching employing the nickel layers 60 as masks for the circuit lines. The soldermask window 56, which is slightly larger than the chip site 26, is formed over the carrier substrate as shown in FIGS. 7 and 8. The nickel coating 60 on the circuit lines is oxidized by the heat which is necessary to cure the soldermask. Nickel oxide then provides non-wettable damming surfaces 63 on the circuit lines, these damming surfaces being adjacent the solder sites 58. Oxidation may also be accomplished by heating the lines to approximately 120° C. for approximately two hours. The flip chip attach scheme is then employed for soldering the C4 solder bumps of the chips to the circuit lines at the solder sites 58. The chip sites are then filled with the encapsulant. When the encapsulant is dispensed into the chip sites it completely covers the solder joints without any voids since there are no soldermask edges impeding the flow as caused by the prior art soldermask.

Nickel is preferred for the solder-wettable metal because of its unique combination of functions in the present invention. Nickel can be plated on the copper circuit lines, it can be plated with solder to form solder sites, it serves as a mask for the circuit lines when the copper foil is etched from the carrier substrate, it is quickly oxidized by heat, such as 125° C. for two hours. Before or after oxidation solder can be plated on it at solder sites and the oxidized nickel provides an excellent solder dam adjacent the solder sites. It should be understood, however, that other less desirable metals could be employed in lieu of nickel, such as chromium and titanium.

A suitable encapsulant for the present invention is taught in U.S. Pat. 5,121,190 assigned to IBM. The above reference to low melt and high melt solders depends on the percentage of tin and lead in the copper. Eutectic solder, which has the lowest reflow temperature, is 63% tin and 37% lead. A typical high melt solder is 90% tin and 10% lead. The thickness of the carrier substrate may be in the order of 0.05 inch. The thickness of the soldermask of the prior art and the soldermask of the present invention may be in the order of 0.001–0.002 inch. The width of the circuit lines is approximately 0.003 inch.

Obviously, other embodiments and modifications of the invention will occur to those of ordinary skill in the art in view of these teachings. Therefore, the invention is to be limited only by the following claims which include all such embodiments and modifications when viewed in conjunction with the above specification and accompanying drawings.

We claim:

1. An electronic module comprising:

a substrate carrier having a chip site;

a plurality of circuit lines formed on the substrate carrier, the circuit lines having end portions which terminate within said chip site;

a soldermask on the carrier substrate, the soldermask having an opening masking only circuit lines outside the chip site;

each circuit line end portion within the chip site having a solder site portion which has a top surface, the top surface of the solder site portion of the circuit line end portion being covered with a solderable material;

each circuit line end portion within the chip site having a solder dam portion which is adjacent said solder site portion and which is coated with a metal oxide layer which is non-wettable to solder;

a chip located at the chip site, the chip having electrodes;

solder joints electrically connecting the electrodes of the chip to the circuit lines at said solder site portions; and an encapsulant filling the chip site and encapsulating said solder joints.

2. An electronic module as claimed in claim 1 wherein each solder site portion is located at a terminal end of an end portion of a respective circuit line and the solder dam portion extends from a respective solder site portion to an edge of the opening of the soldermask.

3. An electronic module as claimed in claim 1 wherein the thickness of the circuit lines is approximately 0.001 inch and the thickness of the nickel layer is approximately 0.0001 inch.

4. An electronic module as claimed in claim 1 wherein the solderable material is gold.

5. An electronic module as claimed in claim 1 wherein the solderable material is copper protected by benzotriazole.

6. An electronic module as claimed in claim 1 including:

the substrate being an organic material;

the circuit line being copper;

said solderable material being nickel; and said metal oxide layer being nickel oxide.

7. An electronic module as claimed in claim 6 wherein the solderable nickel material is covered with solder.

8. An electronic module as claimed in claim 7 wherein high melt solder is located at each electrical terminal of the chip and said solder is low melt solder, the low melt solder being sufficient in volume to form a solder joint without reflow of the high melt solder.

9. An electronic module as claimed in claim 8 wherein each solder site is located at a terminal end of an end portion of a respective circuit line and the solder dam portion extends from the solder site portion to an edge of the opening of the soldermask.

10. An electronic module as claimed in claim 9 wherein the thickness of the circuit lines is approximately 0.001 inch and the thickness of the nickel layer is approximately 0.0001 inch.

11. An interconnect structure comprising:

a substrate;

at least one totally continuous conductive line of a single and homogenous electrically conductive material without material interfaces on said substrate;

said conductive line having a top surface which has a solder site and a solder dam site which are immediately adjacent one another;

a solderable layer;

the solder site and the solder dam site of the conductive line being covered by said solderable layer so that the solderable layer has a solder site and a solder dam site which are immediately adjacent one another;

the solderable layer being a metal which is wettable by solder;

a solderable coating;

the solder site of the solderable layer being covered by said solderable coating;

an oxide of said metal being non-wettable by solder;

a layer of said oxide of said metal; and the solder dam site of the solderable layer being covered by said layer of oxide of said metal.

12. An interconnect structure as claimed in claim 11 including:

said metal being nickel and the oxide of said metal being nickel oxide.

13. An interconnect structure as claimed in claim 11 including:

the solder site being at a terminal end of said conductive line.

14. An interconnect structure as claimed in claim 11 including:

the conductive lines being copper, the solderable layer being nickel, the solderable coating being solder and the metal oxide layer being nickel oxide.

15. An interconnect structure as claimed in claim 11 including:

a soldermask on said substrate and having an aperture which opens said solder site and said solder dam site of the solderable layer.

16. An interconnect structure as claimed in claim 15 including:

the conductive lines being copper, the solderable layer being nickel, the solderable coating being solder and the metal oxide layer being nickel oxide.

17. An interconnect structure as claimed in claim 16 including:

the solder site being at a terminal end of said conductive line.

18. An interconnect structure as claimed in claim 17 including:

the thickness of the solderable layer being approximately 0.0001 inch.

19. An interconnect structure as claimed in claim 11 including:

a plurality of combinations of said conductive lines, solderable layers, solderable coatings and layers of oxide of said metal on said substrate.

20. An interconnect structure as claimed in claim 19 including:

a soldermask on said substrate having an aperture which opens solder sites and solder dam sites of said combinations.

21. An interconnect structure as claimed in claim 20 including:

an electronic chip having electrodes which are connected by solder joints to solderable coatings of the combinations at said solder sites.

22. An interconnect structure as claimed in claim 21 including:

the conductive lines being copper, the solderable layer being nickel, the solderable coating being solder and the metal oxide layer being nickel oxide.

23. An interconnect structure as claimed in claim 22 including:

the conductive lines being spaced from one another within said opening of the soldermask thereby providing a plurality of spaces therebetween; and a filler located in said spaces and encapsulating the solder joints.

24. An interconnect structure as claimed in claim 23 including:

the solderable coating being high melt solder and the solder joint being low melt solder.

25. An interconnect structure as claimed in claim 24 including:

the solder site being at a terminal end of said conductive line.

26. An interconnect structure as claimed in claim 25 including:

the thickness of the solderable layer being approximately 0.0001 inch.

* * * * *